United States Patent [19]

Alcorn

[11] Patent Number: 5,164,663
[45] Date of Patent: Nov. 17, 1992

[54] ACTIVE DISTRIBUTED PROGRAMMABLE LINE TERMINATION FOR IN-CIRCUIT AUTOMATIC TEST RECEIVERS

[75] Inventor: Barry A. Alcorn, Ft. Collins, Colo.

[73] Assignee: Hewlett-Packard Company, Palo Alto, Calif.

[21] Appl. No.: 625,716

[22] Filed: Dec. 5, 1990

[51] Int. Cl.⁵ .................. G01R 31/02; H03K 17/16
[52] U.S. Cl. ...................... 324/158 R; 324/73.1; 307/540; 333/22 R
[58] Field of Search ............ 324/158 R, 73.1; 371/15.1, 25.1, 16.1, 22.6, 20.1; 307/443, 445, 540, 546, 559, 561, 565, 566; 333/138, 22 R

[56] References Cited

U.S. PATENT DOCUMENTS

| | | | |
|---|---|---|---|
| 2,853,630 | 9/1958 | Lane et al. | 307/559 |
| 3,532,982 | 10/1970 | Zeidlhack et al. | 324/72.5 |
| 3,600,634 | 8/1971 | Muench, Jr. | 313/341 |
| 3,660,675 | 5/1972 | Andrews, Jr. | 333/138 |
| 3,832,575 | 8/1974 | Dasgupta et al. | 307/443 |
| 4,450,370 | 5/1984 | Davis | 307/445 |
| 4,675,551 | 6/1987 | Stevenson et al. | 307/542 |
| 4,859,877 | 8/1989 | Cooperman et al. | 307/540 |
| 4,894,829 | 1/1990 | Monie et al. | 371/20.1 |
| 4,943,739 | 7/1990 | Slaughter | 333/22 R |
| 4,947,113 | 8/1990 | Chism et al. | 324/158 R |
| 4,985,672 | 1/1991 | Hashimoto et al. | 326/73.1 |

OTHER PUBLICATIONS

House Holder, Jr. "Schottky Barrier Diode Transmission Line Termination"; IBM Technical Disclosure Bulletin; vol. 19, No. 18; Jan. 1977.

"Analysis, Transmission, and Filtering of signals" by Mansour Javid, Ph.D. and Egon Brenner, D. E. E.—Robert e. Krieger Publishing Company, Inc.—1981.

*Primary Examiner*—Vinh Nguyen

[57] ABSTRACT

A system for providing receiver termination in automatic test equipment wherein the automatic test equipment is capable of testing a plurality of devices under test. The automatic test equipment has a plurality of receivers each of which is connected to the receiver termination system of the present invention. The system selectively connects each receiver termination to one of a plurality of devices under test. Each of the receiver terminations is connected between one of the automatic test equipment receivers and the analog multiplexor and provides a high reference voltage clamping value for clamping signals appearing on the input to the receiver at the high reference value tailored for the specific device under test. It also provides a low reference voltage for clamping signals appearing on the input of the receiver at a low reference voltage value tailored to the device under test. An analog reference control is connected to each of the plurality of receiver terminations and delivers to each receiver termination high and low reference voltage clamping values tailored for each device under test connected to the receiver termination. A state machine controls the delivery of the high and low reference clamping voltage values to the receiver terminations.

10 Claims, 9 Drawing Sheets

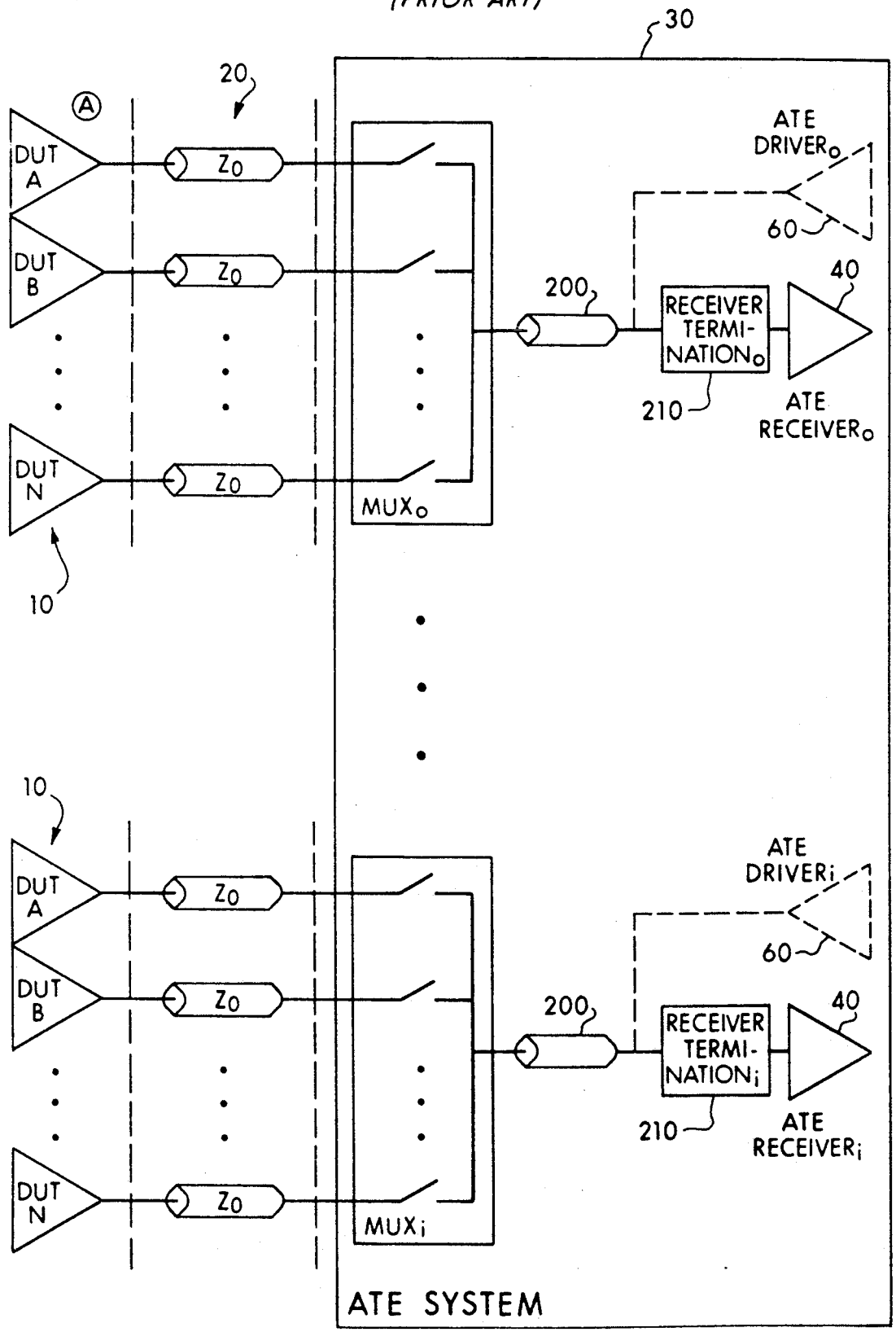

Fig. 3
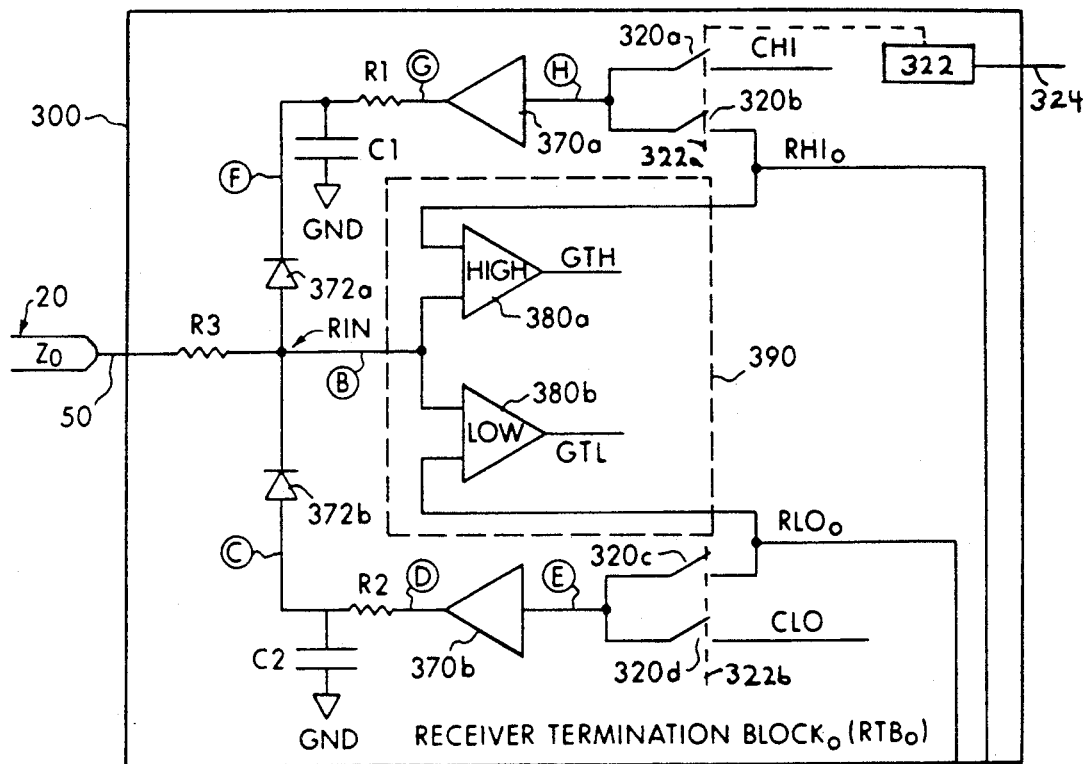
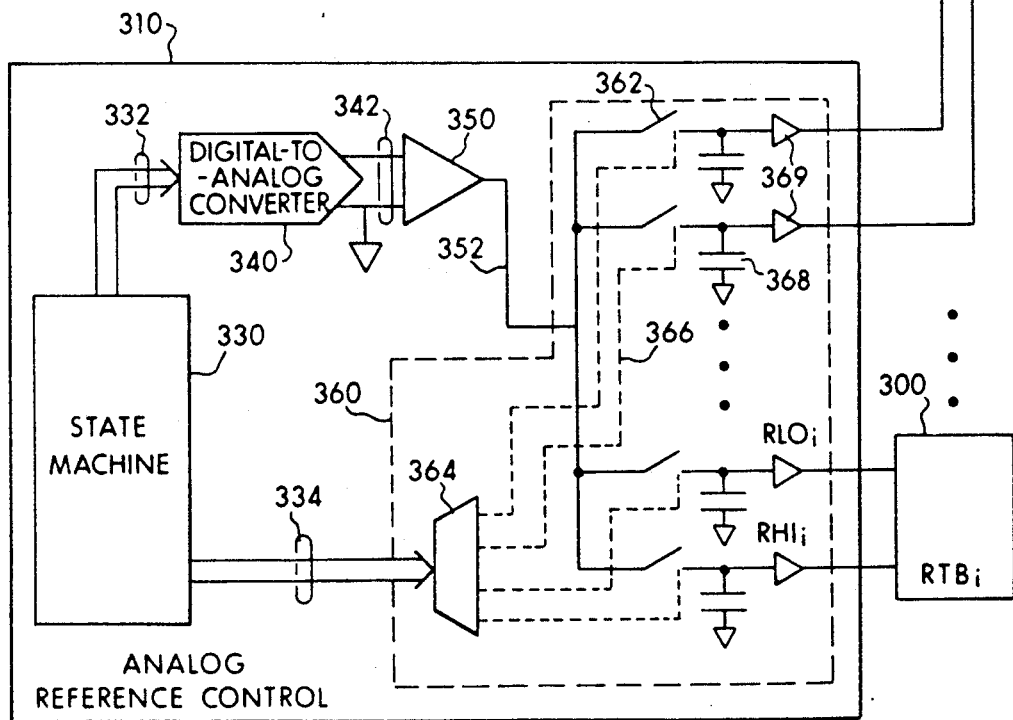

Fig. 5
(CONTINUED)
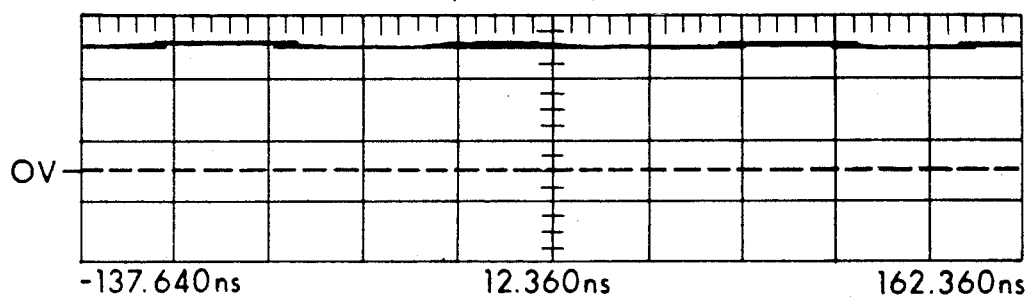
F
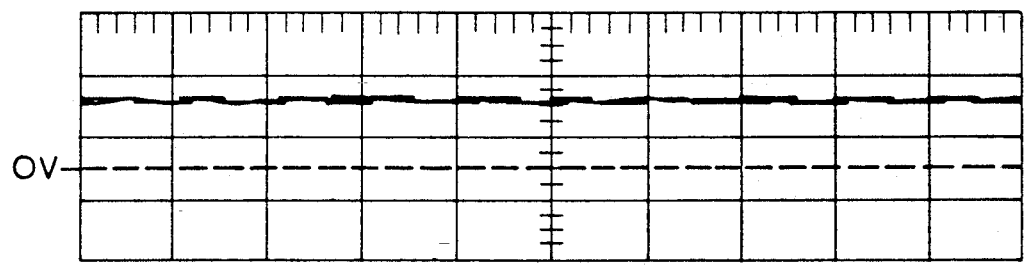
G
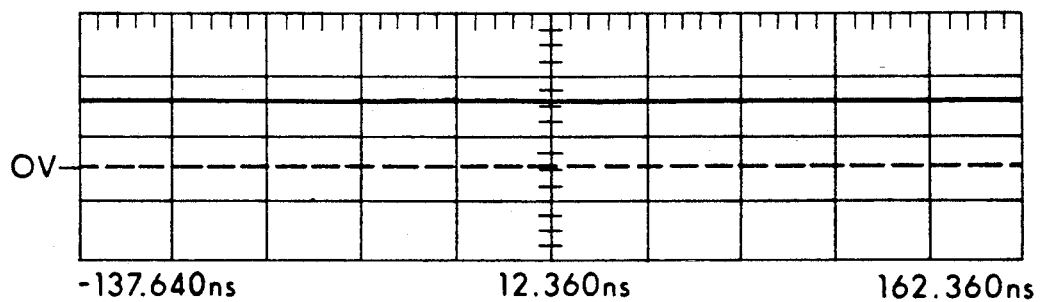
H

ACTIVE DISTRIBUTED PROGRAMMABLE LINE TERMINATION FOR IN-CIRCUIT AUTOMATIC TEST RECEIVERS

BACKGROUND OF THE INVENTION

1. Field of the Invention

The present invention relates to termination of transmission lines and, in particular, the present invention relates to receiver termination of devices-under-test (DUTS) in automatic testing equipment (ATE).

2. Statement of the Problem

The termination of transmission lines represents an area of signal analysis that has been well studied. See, for example, Javid and Brenner, Analysis Transmission and Filtering of Signals, "Transmission Lines 1-Transients", Pages 334-347, 1981 (Robert E. Krieger Publishing Co., Inc., Malabar, FL).

The goal of ATE systems is to provide a test interface to a large number of different types of DUTs. The ATE system applies a stimulus to the DUT and then looks for an appropriate signal response. For digital DUTs, the ATE system drivers drive the correct logic levels for a valid "1" or "0" to the inputs of the DUT and then the digital receivers in the ATE system look for a valid "1" or "0" at the outputs.

In FIG. 1a, a typical device-under-test (DUT) interconnected through a fixture and a printed circuit (PC) board 20 with an automatic test equipment (ATE) system 30 containing a receiver 40 and a driver 60. Receiver 40 in an ATE system (generally indicated at 30) probes the DUT 10 in order to determine the function of the circuit without interfering with the operation of the circuit. This normally implies keeping the input 50 to the receiver at a high impedance. However, the connection of the receiver 40 to the DUT 10 adds some parasitic capacitance $C_P$ to ground thereby partially affecting the operation of the DUT.

An optional three state driver 60, shown in dotted lines, may be selectively interconnected by means of a switch 70 to the input 50 to drive a signal into the DUT.

The ATE system 30 contains a number of receivers 40 and drivers 60 and will be discussed more fully with respect to FIG. 2.

In FIG. 1a, when the receiver 40 input impedance is high compared to the impedance $Z_O$ of the fixture in PC board 20 and the source output resistance $R_S$ is low (compared to $Z_O$) then the waveform from the DUT at the receiver input 50 will overshoot. This results in a classic ringing problem. If $R_S$ is small, a larger voltage (hence, more current) will be delivered down the transmission line by the DUT. In other words, the waveform at the receiver 40 overshoots the source voltage $V_S$ from the DUT and then undershoots below $V_S$. The amount of current initially sent down the line is determined by the instantaneous impedance seen at the $R_2$-$Z_O$ interface. As the waveform travels down the transmission line it then encounters the $Z_O$- input 50 of receiver 40 interface. The receiver 40 typically is of much higher impedance than $Z_O$ thereby causing the voltage waveform to overshoot. (Note: The initial voltage sent down the line is $$V_s \frac{Z_o}{R_s + Z_o}$$

when $R_S$ is small, a good approximation for many of these high speed DUTs.) Eventually, the ringing damps down to a steady state value of $V_S$. In an ATE system, one of the problems is to design the receiver 40 such that it is capable of interfacing with many different DUTs having varying output impedances in a fashion to minimize the ringing problem. Hence, a low cost, easy to implement design for receiver 40 is needed.

The problem of ringing is further enhanced when short wire length PC fixtures 20 are required because of the high speed of the digital circuits found in the DUTs (i.e., this assumes a lossy transmission line). Hence, a need also exists in the design of a receiver 40 that provides minimum impact on the DUT 10 (that is, having no DC loading and no degradation of AC performance) but which is inexpensive and easy to implement.

There are several ways to conventionally terminate a receiver 40 for ATE equipment and these are illustrated in FIGS. 1b through 1d. In FIG. 1b, a resistive load $R_L$ is connected from input 50 of the receiver 40 to ground. The resistor $R_L$ equals $Z_O$. This particular termination works well provided the DUT can output a sufficient amount of current ($I = V_S \div (R_L + R_S + R_{DC})$) and provided $R_S$ is small compared to $R_L + Z_O$. $R_{DC}$ is the lumped resistance of the transmission line. Furthermore, there is no mismatch or reflection at the receiver input 50 since $R_L = Z_O$. One disadvantage of the prior approach of FIG. 1b is that the DUT 10 must be able to supply the aforesaid value of current to the transmission line 20 when driving high. Many DUTs 10 cannot supply that amount of current.

In FIG. 1c, a second prior art solution for terminating a receiver 40 in an ATE system 30 is shown. A resistor $R_L$ which is equal to $Z_O$ is terminated on the variable drive 60. A second resistance $R_A$ is added at the output 80 of the DUT 10. The addition of resistor $R_A$ further isolates the DUT 10 from the ATE system 30. But the addition of resistor $R_A$ also means that the parasitic capacitance $C_{PDUT}$ becomes more important. If a correct value of $R_A$ can be found, the DUT 10 can be adequately isolated from the ATE 30. The problems with the prior art approach shown in FIG. 1c are substantial. For some DUTs 10 there is no good value for $R_A$. The presence of parasitic capacitance $C_{PDUT}$ can potentially limit the speed of the ATE in conducting the test. Furthermore, driver 60 now must drive through both $R_L$ and $R_A$ which may be a problem when overdriving (a lot of current may be required). Overdriving occurs when the driver 60 drives a node to a known state regardless of where an enabled upstream device may wish to drive the node. Finally, the implementation of FIG. 1c requires $R_A$ to be physically close to the DUT 10 which involves fixturing problems.

In FIG. 1d, the most common technique which is frequently used in industry is set forth. Here, a resistor $R_L$ is connected in a series connection to a capacitor $C_L$ which connects the input 50 of receiver 40 to ground. Capacitor $C_L$ isolates the resistor $R_L$ from ground. Hence, the resistor $R_L$ does not DC load the DUT 10 but the capacitor $C_L$ will add to the receiver input capacitance which can limit test speed. The clear advantage of the approach of FIG. 1d is that the resistor $R_L$ is only "present" in the circuit when a signal transition from the DUT 10 occurs at the input 50. Termination is only present when the signal at the input 50 is changing state. Hence, no DC loading. One disadvantage with the prior art approach of FIG. 1d requires that $Z_O$ must be well controlled as inductance of the line 20 can form a tank circuit with $R_L$ and $C_L$ which would cause oscillations. Furthermore, $C_L$ will add to the receiver 40 additional parasitic capacitance and increase the effective input capacitance presented to the DUT thereby limiting the speed and performance of the DUT 10.

A need therefore exists for a receiver which can be selectively programmed to a specific DUT 10 which will provide a necessary termination at the input 50 to absorb energy from ringing. The design of this circuit must not interfere with the acquisition of a valid high or low signal from a wide variety of different types of DUTs 10.

FIG. 2 illustrates a typical prior ATE system capable of interfacing with a number of DUTs 10. In FIG. 2, the ATE system 30 includes a set of analog multiplexors ($MUX_O$ - $MUX_J$) (e.g., relays) wherein each multiplexor is interconnected over a fixture and PC board 20 to a plurality of DUTs 10 ($DUT_A$ - $DUT_N$). Other prior art approaches use different techniques to connect the receivers to an individual DUT (such as changing fixtures, etc.). Hence, each receiver termination 50 can be selectively connected by the multiplexor to a discrete DUT 10 in a set of DUTs 10. A measurement can then be taken by the receiver 40 of the signal output of the connected DUT. The receiver termination 210 in FIG. 2 may constitute any one of the above prior art approaches fully discussed in FIG. 1.

The DUTs 10 as shown in FIG. 2 may be of a number of different logic families. These different logic families will have different valid logic thresholds. For example, transistor-transistor logic (TTL) has a signal threshold of 2.0 volts and complementary metal oxide semiconductor (CMOS) has a signal threshold of 4.0 volts, both for a valid digital "1." Furthermore, the output impedance of each logic family is also different. Hence, a need exists for each receiver to have active termination thresholds so as to adjust to the signal characteristics of the DUT being tested.

Since many different logic families may be represented in the DUTs 10, ATEs are presently available wherein each receiver 40 has programmable thresholds on a per receiver basis (e.g., receiver high, receiver low, drive high, drive low). This capability is called "per-pin programmable logic threshold" in the industry. Finally, a need exists to provide distributed programmable clamps on a per-pin basis so as to provide an active termination for the receivers 40.

2. Results of a Patentability Search

A patentability search was directed in the field of the invention to the solution of the above problem. The results of the patentability search generated the following patents:

| Muench, Jr. | 3,600,634 | 8-17-71 |
| Andrews, Jr. | 3,660,675 | 5-2-72 |
| Dasgupta et al. | 3,832,575 | 8-27-74 |
| Davis | 4,450,370 | 5-22-84 |
| Slaughter | 4,943,739 | 7-24-90 |

U.S. Pat. No. 3,660,675 sets forth a design for terminating a low output impedance source by adding a series termination when the device is sinking, in a diode (no series termination) when the device is sourcing.

U.S. Pat. No. 4,450,370 sets forth an active termination for a transmission line involving a tri-state buffer enabled by a strobe signal. The output of the tri-state buffer is tied through a resistive element which is used to help match the line impedance of the transmission line.

U.S. Pat. No. 3,832,575 sets forth a data bus transmission line termination circuit which is programmable to either a low impedance state for connection to the terminal end of the data bus or to a high impedance state for connection to an intermediate portion of the data bus.

U.S. Pat. No. 3,600,634 issued to Muench, Jr. sets forth a protective control circuit against transient voltages utilizing a pair of solid state gate controlled AC switches. This patent deals with an over voltage circuit which shunts around a load for protection if an over voltage occurs.

U.S. Pat. No. 4,943,739 sets forth a non-reflecting transmission line termination which contains a reflection attenuator connected between the signal line and the ground line or signal line and the power line. The attenuator clamps the voltage of digital signals between ground potential and the supply line voltage. This invention is the most pertinent of the patents uncovered in the search to the solution of the above problem. However, this invention is not applicable to the environment of ATE systems. The signal swing of '739 must be close to $V_{CC}$ or to ground and, therefore, is not appropriate for use in an ATE. The '739 patent does not deal with the situation involving different types of DUTS— where, for example, the $V_{CC}$ is not always the same. Furthermore, the '739 approach requires a third line for $V_{CC}$, does not provide for high currents, and does not handle the situation where $V_{CC}$ is less than ground.

3. Solution to the Problem

The present invention provides a solution to the needs set forth in FIGS. 1 and 2 by providing an active distributed programmable line termination for the receiver 210 which is fully programmable on a per-pin basis in an ATE system. The present invention provides a receiver termination which extracts energy from the output DUT signal only when the signal has passed a defined threshold level. Two embodiments of the present invention are set forth. In the first embodiment, the termination voltage is tied to the per-pin programmable (distributed) receiver threshold while the second embodiment allows the termination voltages to be programmed independently on a per-pin basis. Both embodiments provide per-pin programmability of the terminated voltages. Furthermore, the present invention eliminates AC loading caused when the edges of the DUT signal are going through a transition and provide only small DC loading which is present only when the signal from the DUT has exceeded the termination voltage value.

SUMMARY OF THE INVENTION

A system for providing programmable active receiver termination in automatic test equipment wherein the automatic test equipment is capable of testing a plurality of devices under test. The automatic test equipment has a plurality of receivers each of which is connected to the receiver termination system of the present invention. The system is further connected to an analog multiplexor which selectively connects each receiver termination to one of a plurality of devices under test.

Each of the receiver terminations is connected between one of the automatic test equipment receivers and provides a high reference voltage for clamping signals appearing on the input to the receiver at the high reference voltage tailored for the specific device under test. It also provides a low reference voltage for clamping signals appearing on the input of the receiver at a low reference voltage clamping value tailored to the device under test.

An analog reference control is connected to each of the plurality of receiver terminations and delivers to each receiver termination high and low reference voltage clamping values tailored for each device under test connected to the receiver termination. A state machine controls the delivery of the high and low reference clamping voltage values to the receiver terminations.

DESCRIPTION OF THE DRAWING

FIG. 2 is a prior art representation of a conventional ATE System;

FIG. 3 sets forth the first embodiment of the termination system of the present invention;

DETAILED SPECIFICATION

Figure 1A:
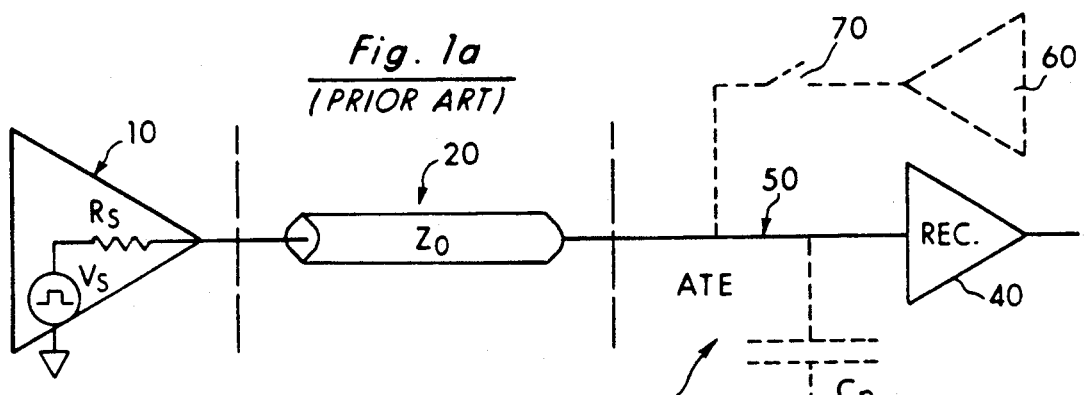
FIG. 1 are prior art representations of circuits for terminating a transmission line.
Figure 1B:
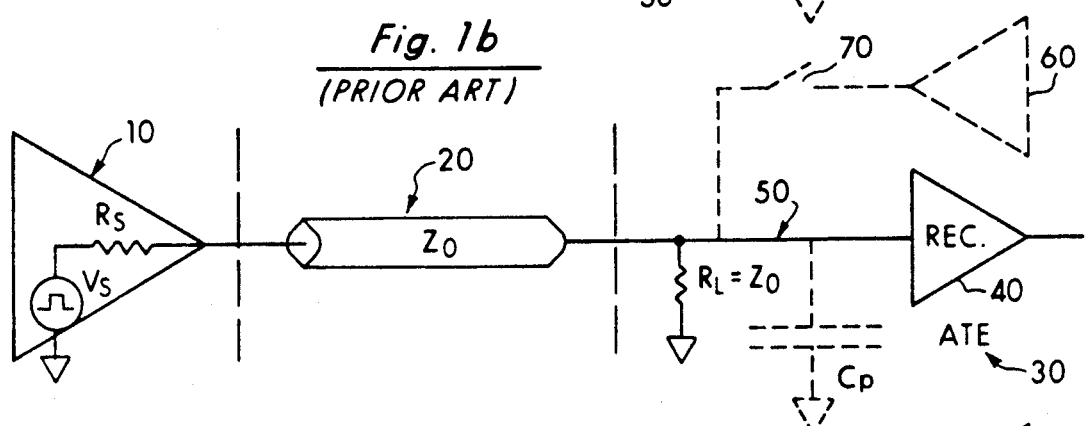
Figure 1C:
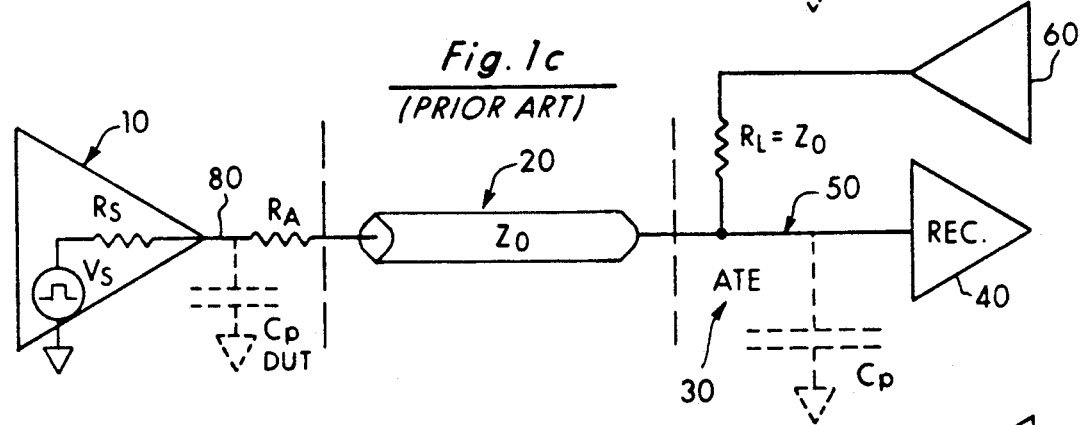
Figure 1D:
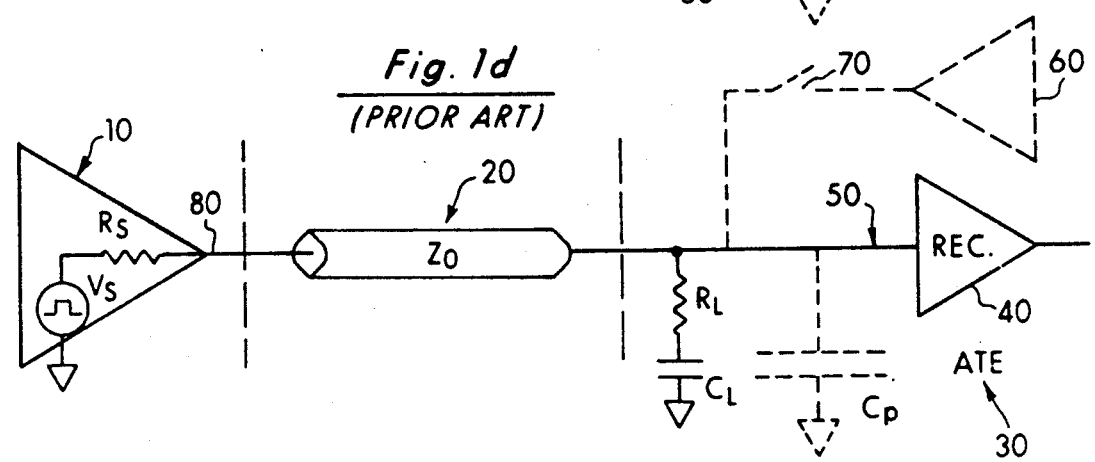

1. First Embodiment of a Receiver Termination Block

In FIG. 3, the first embodiment of a receiver termination block (RTB) 300 is shown interconnected with an analog reference control 310. The analog reference control 310 is interconnected with a number of receiver termination blocks. With reference back to FIG. 2, if there are "i" receiver terminations, then the analog reference control 310 would interface with "i" receiver termination blocks 300. This is shown in FIG. 3 for RTB. The analog reference control 310 outputs termination voltages as distributed per-pin programmable receiver thresholds, RHI and RLO. However, as shown in FIG. 3, the termination voltages can also be tied to set reference levels, CHI and CLO. Whether programmable receiver thresholds RHI and RLO or set reference levels CHI and CLO are utilized, is dependent upon the settings of switches 320a and 320b. The CHI and CLO signals are provided for those DUTs 10 which do not ring and which cannot drive small dc loads in the termination. Hence, CHI and CLO are outside the programming range of the receiver thresholds (i.e., $CHI > RHI_{MAX}$ and $CLO < RLO_{MIN}$).

a. Analog Reference Control 310

The analog reference control 310 incorporates a state machine 330, a digital to analog converter 340, an amplifier 350, and an integrated sample-and-hold circuit 360. The state machine 330 is interconnected over lines 332 to the digital to analog converter 340 which in turn is connected over lines 342 to the amplifier 350. Amplifier 350 in turn is connected over line 352 to the integrated sample-and-hold circuit 360. Address and enable information is delivered over lines 334 to the integrated sample-and-hold circuit 360. The integrated sample-and-hold circuit delivers the RLO and RHI threshold levels to the receiver termination blocks ($RTB_O$ - $RTB_I$).

As will be evident in the following, the analog reference control 310 provides per-pin voltages (RHI and RLO) which are used as references by the receiver termination blocks to individually configure the receiver termination block to test a particular DUT 10 so as to minimize ringing. Each different DUT type will have its own RHI and RLO reference voltages. Each analog reference voltage is separately programmable within a valid output range which in the preferred embodiment is negative 5.5 volts to positive 5.5 volts. The valid range of receiver levels is negative 3.5 volts to positive 5.0 volts. The state machine 330 cycles through all possible addresses so as to refresh each sample-and-hold 360 which in the preferred embodiment is every five microseconds with an actual switch 362 closure time of 1.6 microseconds. The address and enable information is delivered over lines 334 to the address decoder and switch select 364 which activates switches over lines 366.

The state machine 330 is implemented on an ASIC which incorporates a random access memory (RAM), not shown. The state machine 330 conventionally operates to cycle through each address of the sample-and-hold circuit 360 which in the preferred embodiment constitutes 48 separate addresses. For each address, the state machine further provides data to the digital-to-analog converter 340. This data is delivered from the RAM lines 332, this data constitutes the necessary digital information to provide the analog threshold voltage signals amplified by amplifier 350 on lines 352. The state machine 330 also provides the address for the sample-and-hold circuit 360 on lines 334 and an enable signal also on lines 334 that closes the addressed switch 362 from the analog line 352 to the addressed hold capacitor 368.

Hence, an address is delivered out from the state machine 330 on lines 334 to the address decoder and switch select 364. Simultaneously an output from the RAM internal to the state machine 330 is delivered on lines 332 to the digital-to-analog converter 340 which delivers the analog threshold value to the integrated sample-and-hold circuit 360. After the appropriate address setup time on 334 and analog voltage setting time (on 352), the switch 362 becomes activated and the analog value appearing on line 352 is delivered into a holding capacitor 368 for subsequent delivery as RHI or RLO to the addressed receiver termination block 300.

In the preferred embodiment, 3.2 microseconds are provided for the voltage to become stable on line 352 before the enable signal on line 334 loads the value into the holding capacitor 368. The enable signal stays active for 1.6 microseconds allowing the hold capacitor 368 to be charged to the correct threshold value. An additional 200 nanoseconds of hold time is then encountered after the enable becomes inactive and then the state machine provides the address and data for the next hold capacitor.

The digital-to-analog converter 340 and the amplifier 350 operate as follows. The digital-to-analog converter 340 is of the type that provides a current output. The digital-to-analog converter 340 converts the data being inputted on lines 332 from the state machine 330. In the preferred embodiment, the digital-to-analog converter 340 utilizes a twelve digital bit input running off of a ten volt reference. The output of the digital-to-analog converter 340 feeds two operational amplifiers 350, not shown. The first operational amplifier swings between 0 to minus ten volts depending upon the data on lines 332 and the second operational amplifier inverts the result of the first and level shifts the signal so that it runs minus 5.5 volts to plus 5.5 volts. For simplicity, only a single amplifier 350 is shown in FIG. 3.

The integrated sample-and-hold circuit 360 utilizes a decoder multiplexor 364 which selects one of the 48 sample-and-holds (based upon six binary bits). The enable bit from the state machine 330 closes the internal FET switch 362 from the analog input 352 from the digital-to-analog converter 340. Closure allows the internal hold capacitor 368 to be selectively charged, as discussed above. The voltage at the hold capacitor 368 is buffered from receiver termination blocks 300 with a low current unity gain operational amplifier 369.

It is to be expressly understood that while a preferred design for the analog reference control is shown that other designs that selectively deliver RHI and RLO reference voltages to the receiver termination block could also be used and would fall under the teachings of the present invention.

b. Receiver Termination Block 300

The receiver termination block 300, as shown in FIG. 3, is connected to the fixture and PC board 20 at its input 50. This corresponds to the conventional prior art circuits of FIG. 1. Likewise, the receiver termination block 300 is interconnected to the analog reference control 310 over lines $RHI_O$ and $RLO_O$. Finally, the receiver termination block 300 delivers to the receiver outputs GTH and GTL from receiver 390.

In the receiver termination block 300 are the analog switches 320, a high current unity gain buffer 370, and the high and low threshold comparators 380. The diode 372a is connected through resistor R1 to the output of buffer 370a. The output of buffer 370a is connected to resistor R1 and through capacitor C1 to ground. Likewise, the output of buffer 370b is connected to resistor R2 and through capacitor C2 to ground. The output of resistor R2 is also connected to the input of diode 372b. The RHI threshold signal is delivered into the high threshold comparator 380a whose output is a greater-than-high (GTH) indication. The RHI signal is also delivered through analog switch 320b into buffer 370a. Likewise, RLO is delivered into the input of the comparator 380b whose output is a greater-than-low (GTL) indication. RLO is also delivered into the input of the buffer 370b.

The analog switches 320 allow the termination voltage to be tied to RHI and RLO or to CHI and CLO. CHI and CLO are voltages which will insure that the clamps can be turned off by programming the termination voltages beyond the valid programming range of RHI and RLO. The analog switches 320 are digitally controlled by the control register 322 over lines 322a and 322b. The control register 322 is selectively loaded over lines 324 by the operator of the ATE system. Switches 320 are preferably DG211-a digitally controlled FET switches.

The high current unity gain buffers 370a and 370b provide a solid high current voltage source to the RTB. The buffers 370a and 370b are implemented as an operational amplifier with an external current boost transistor in the feedback loop, not shown.

Resistors R1 and R2 are current limit resistors which isolate their respective capacitors C1 and C2 from their respective high current buffer amplifiers 370a and 370b and prevent excessive currents from being drawn through the circuit if RLO is greater than RHI. This is accomplished without adding an RC time constant to RIN. In the present invention, when RHI (or RLO) is changed, the capacitor C1 adjusts to the new voltage level. The isolation from the high current amplifier 370a and 370b keeps the voltage at the receiver input (RIN) from pulling around the voltage source when high speed pulses are stuffed into the termination 50. The isolation resistors R1 and R2 further protect the clamps from damage when RHI<RLO. Finally, the isolation resistors R1 and R2 will limit the DC load seen by the DUT when the clamps are on.

The capacitors C1 and C2 provide charge storage and high frequency bypassing. The size of these capacitors is dictated by the necessary high frequency response (i.e., good high frequency bypassing) and settling time requirements when the termination voltages are changed. In the preferred embodiment, these capacitors have values in the range of 0.1 $\mu$F to 2.2 $\mu$F.

The diodes 372a and 372b are Schottky barrier diodes in a conventionally available dual SOT-23 package. The diodes must function to turn on fast. The dual threshold receiver 390 is driven by the voltage at the receiver input (RIN). Dual threshold receiver 390 is essentially a voltage window receiver which uses the two comparators 380 to compare against a valid high threshold RHI and a valid low threshold RLO. Receiver outputs, as given by GTH and GTL determine the state of the receiver input RIN as follows:

VALID HIGH

RIN>RLO implies GTL=1.

RIN>RHI implies GTH=1

VALID LOW

RIN<RLO implies GTL=0.

RIN<RHI implies GTH=0

WINDOW ERROR

RIN>RLO implies GTL=1,

RIN>RHI implies GTH=0

A window error is considered an error state as the input is between the valid high (RHI) and valid low (RLO) threshold:

RIN<RLO implies GTL=0

RIN>RHI implies GTH=1

This state should never occur and is therefore undefined (this condition means RHI<RLO).

Resistor R3 has two functions. First it isolates the voltage at the receiver input RIN from electrostatic discharge and overvoltage conditions and it helps limit the current when the termination is on. Hence, the output voltage from the DUT 10 appearing at 50 will be clamped to $RHI + Ioh_{MAX} \times (R1+R3) + 0.3$ volts high and $RLO - Iol_{MAX} \times (R2+R3) \times 0.3$ volts low.

Where:

RHI = valid high threshold programmed for receiver (e.g., normal TTL logic families +2.0 volts)

RLO = valid low threshold programmed for receiver (e.g., normal TTL logic families = 0.8 volts)

Ioh$_{MAX}$=maximum high-level output current supplied by DUT

Iol$_{MAX}$=maximum low-level output current supplied by DUT

The 0.3 volts in the above equations are attributable to the drop across diodes 372.

While a preferred design has been provided for the receiver block termination 300 of FIG. 3, it is to be expressly understood that any suitable design functioning as described above would fall under the teachings of the present invention.

2. Second Embodiment of Receiver Termination Block

Figure 4:
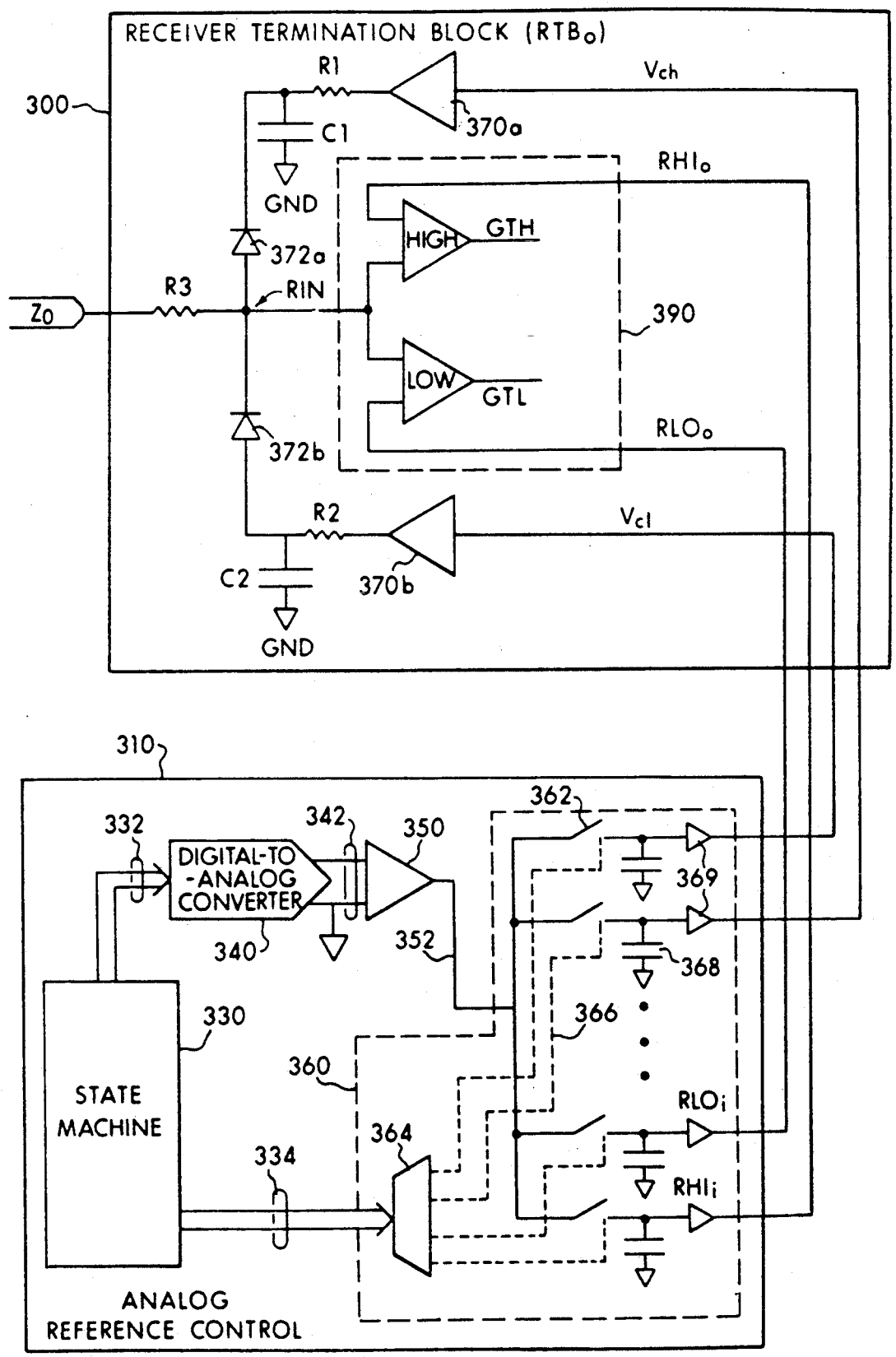
FIG. 4 sets forth the second embodiment of the termination of the present invention.

In FIG. 4 a second embodiment of the receiver termination block 300 of the present invention is set forth. Where possible, like components have been numbered with the same numerals as in FIG. 3. The operation between the two embodiments is identical except as follows.

In FIG. 4, the termination voltages represented by V$_{CL}$ (V clamp low) and V$_{CH}$ (V clamp high) are also delivered from the analog reference control 310. Hence, the second embodiment allows complete per-pin programmability of the termination voltage independent of the receiver threshold voltage. Accordingly, the state machine 330 and the integrated sample-and-hold circuit 360 are suitably expanded to allow for the delivery of four analog voltage values per receiver termination block. Hence, the second embodiment allows complete per-pin programmability of the termination ..voltage independent of the receiver threshold voltage. This allows additional flexibility and fine tuning at the termination voltage for optimum performance. The tradeoffs in the second embodiment to provide this fine tuning results in the delivery of four rather than two reference voltages and the complexity of the analog reference control is greater and more costly.

3. operation of the Present Invention

The following FIG. 3 illustrates the operation of the first embodiment, but is to be understood that this could also apply to the second embodiment. In the first embodiment, the signal positions B through H are shown in FIG. 3 based upon a signal outputted from the DUT 10 indicated by A in FIG. 2.

Figure 5:
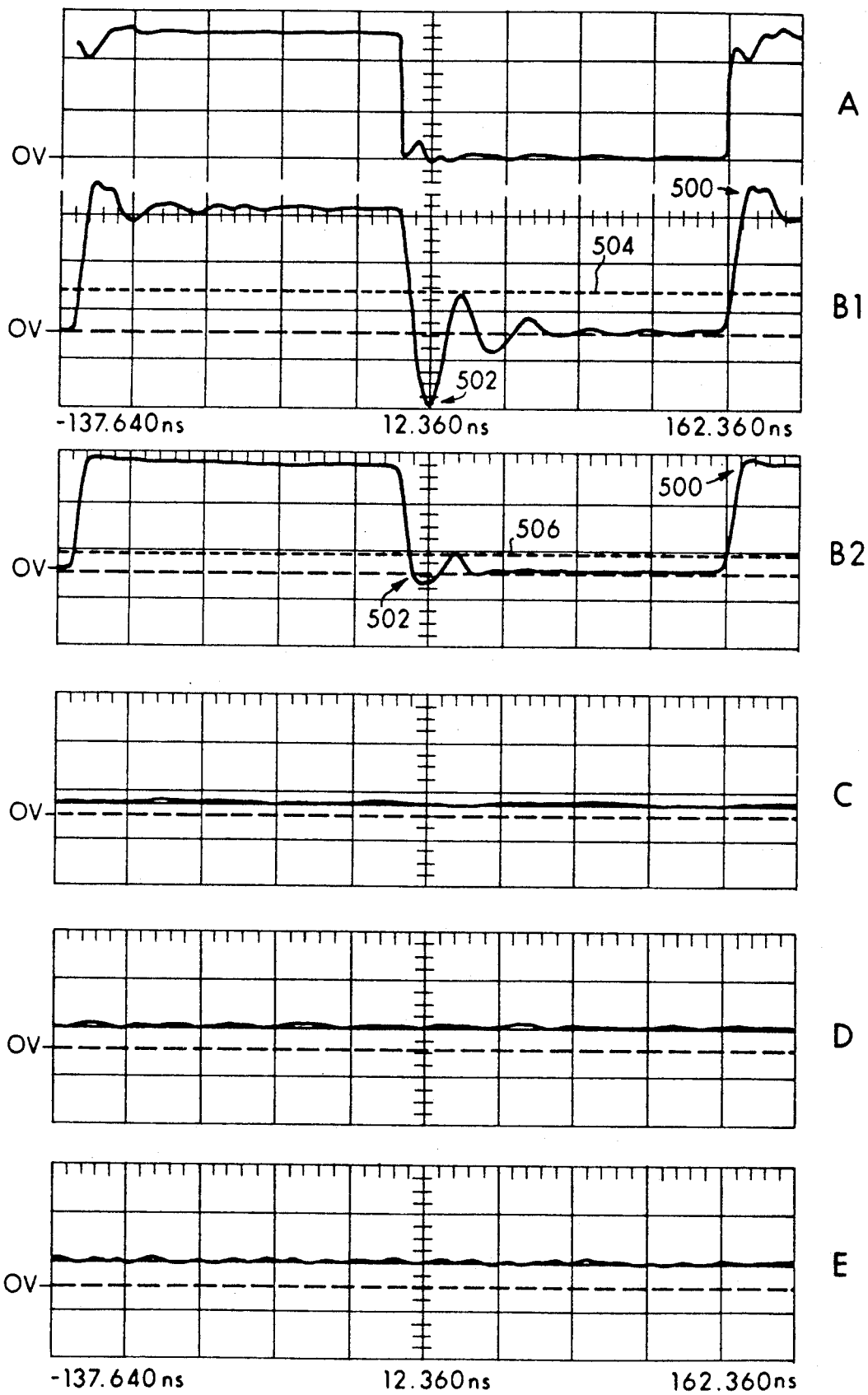
FIG. 5 are graphical representations of the signals at various locations in the first embodiment of the automatic test system of the present invention.

In FIG. 5, the representations of oscilloscope pictures for testing a DUT composed of ACT (i.e., Advanced CMOS with TTL compatible inputs) parts are shown in graphs A through B. ACT devices have a full CMOS swing (0.4 to 4.8 volts) on their outputs while being compatible with TTL on their inputs (0.8 to 2.0 volts).

The measurement setup for FIG. 5 is as follows. A 74ACT00 is connected through a standard fixture onto an ATE PC board which contains a receiver with the termination as shown in embodiment one (see FIGS. 2 and 3) to reference probe points as given by A, B, C, D, E, F, G, and H.

The DUT, an 74ACT00, in DIP package is driven by a Hewlett Packard 80013B pulse generator at a frequency of 7.5 MHz. The power supplies on the DUT are set to 5.0V. Since the device is of the ACT family, the receiver thresholds are programmed to RLO =0.8V and RHI=2.0V rather than the default CMOS levels of RLO=0.4V. and RHI=4.0V. Hence switches 320c are set to deliver RHI and RLO.

FIG. 5, graph A, shows the waveform at the DUT (refer to FIG. 2—Point A) with the clamps on. The vertical axis has a scale of 2 volts per grid, the timescale is 30 nsec/div. This is also the trigger for the oscilloscope—an HP 54110D digital oscilloscope.

Graphs B1 and B2 of FIG. 5 show the DUT waveform at the receiver RIN input (point B of FIG. 3). B1 shows the case where the termination of the present invention is not present (i.e., ringing) while B2 shows the case where the termination is present. The ringing without termination in B1 is 1.76 volts as shown by line 504 and the ringing with termination is 0.78 volts as shown by line 506. Note that the rising edge 500 does not ring as much as the falling edge 502 between the two graphs B1 and B2. For this particular voltage swing there is a secondary effect, inherent in a protection circuit in the receiver, that absorbs some of the energy. For CMOS with lower supplies (3.3v logic) the ringing will be much greater on the rising edge (i.e., similar to what is displayed on the falling edge of graph B1).

Note that the diode 372 and capacitor C are not ideal. This non-ideality shows up as a finite turn-on time which allows these fast edges to overshoot slightly the first time and ring once. Note that the peak of the ring (as shown by 506 in FIG. B2) never reaches the RLO threshold of 0.8 volts. If further improvement becomes necessary a faster diode and better capacitor C can be chosen to reduce the single ring and the voltage 506. This implementation was the best cost-performance trade-off. The example of FIG. 5 also represents the worst performance configuration. Changing the fixture, DUTs, PC board, and grounding to DUTs PC board also improves the performance as characterized by the ringing seen at the receiver.

FIG. 5, graph C shows the voltage at point C of about 0.52 volts, between diode 372b and capacitor C2 of FIG. 3. This is the normal voltage at point C (the RLO termination) for a reasonable ATE test frequency of 7.5 MHz. (This voltage will move somewhat as the capacitor charges and discharges at lower frequency as displayed in FIG. 6, graph C.)

FIG. 5, graph D shows the output at the voltage source 370b of about 0.968 volts. Notice that this point is a little noisy. This noise is from circuitry switching and impinging upon the non-ideal voltage source (i.e., AC bandwidth does not equal infinity). The trace length on the PC board through the isolation resistor and to the filter capacitor can reach upwards of fourteen inches. Such noise can be minimized by proper routing of grounds and signals.

FIG. 5, graph E shows the RLO voltage of 0.96 volts as programmed into the termination circuit 300. Notice that this voltage is 200 millivolts above the peak voltage seen in graph B2.

FIG. 5, graphs F, G, and H show similar points on the high side of the termination. Graph F is the voltage of 3.92 volts between diode 372a and capacitor C1 of FIG. 3. This is the voltage that sets the point where the diode 372a will turn on. Graph G is the voltage output (2.16 volts) of the high current buffer amplifier while graph H is the RHI voltage input of 2.16 volts to the buffer amplifier and receiver. Notice that the voltage of graph F is somewhat above the voltage of graphs G and H. This is because as the diode 372a is on more and more the capacitor tends to charge up. Therefore, at higher frequencies the termination point will tend to move away from the threshold increasing the difference in voltage between the clamp value and receiver threshold voltage. This implies that there is more noise margin and the DUT is more lightly loaded. The voltages shown in FIG. 5, graph C acts the same way—only the magnitude is smaller.

FIG. 5 illustrates the operation of the present invention of FIG. 3. The valid high and low thresholds of RHI=2.0 volts and RLO=0.8 volts are delivered to the termination block 300 by the analog reference control 310. These values correspond to the specified values of TTL. Hence, receiver 390 uses these values in comparators 380 to generate the GTH and GTL signals (i.e., when the voltage at B exceeds RHI=2.0 volts it is a valid high). However, the rising edges of the digital signal are clamped at a predetermined high voltage value (based on RHI, which, for example in FIG. 5, Graph F is 3.92 volts) to minimize ringing. Likewise, the falling edges of the digital signal are clamped at a predetermined low voltage value (based on RLO, which, for example in FIG. 5, Graph C is 0.52 volts). The digital signal between these clamping values is not affected.

Figure 6:
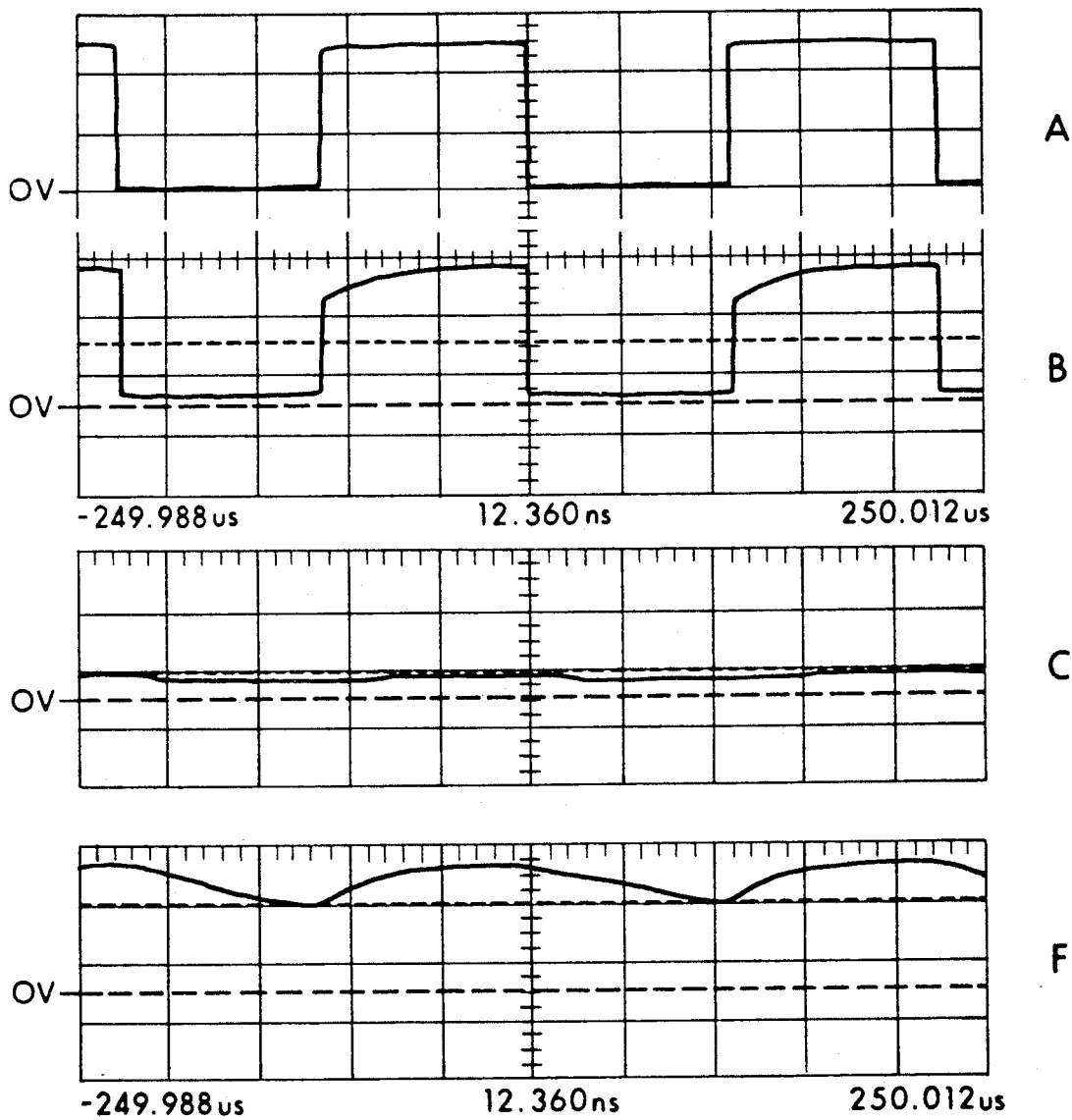
FIG. 6 sets forth graphical representations of the signals corresponding to a different frequency than that set forth in FIG. 5.

The graphs of FIG. 6 use the same measurement setup as FIG. 5 (voltage is 2 volts per division with a time base of 50 microseconds/division). The only difference is the frequency at which the DUT is switching—now only 4.5 KHz—rather slow for an ATE but certainly possible for some cases. Graph A is again the DUT waveform as shown at point A of FIG. 2. Graph B, of FIG. 6, shows the DUT waveform at point B, the receiver input—RIN. Notice at this lower frequency the lessening of the load on the DUT as the capacitor charges (most noticeable on the positive going pulse).

Graphs C and F of FIG. 6 shows the capacitor C charging and discharging. Charging takes place through the diodes 372 respectively. Discharging takes place through resistors R2 and R1. There is no adverse affects on the termination circuit or the receiver input, RIN, at startup or low frequency operation.

FIG. 7 shows a blowup of the ringing at the receiver input (voltage is 2 volts per division and the time base is 10 nsec/division). The top signal of FIGS. 7a-7d shows the DUT waveform at A on FIG. 2 while the bottom waveform shows the waveform at part B of FIG. 3.

Figure 7A:
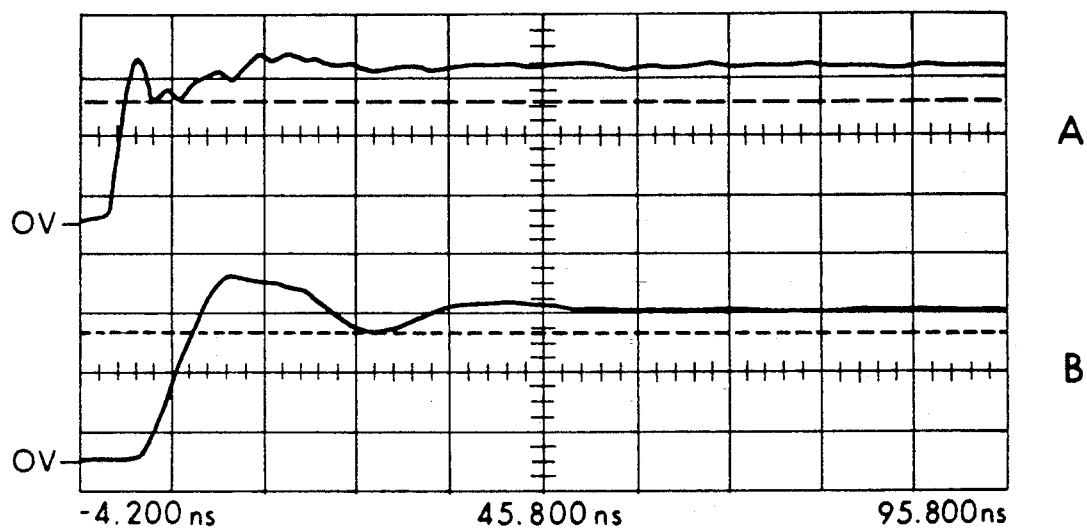
FIG. 7 sets forth graphical representations of the signals for testing an ACT family of DUTs.
Figure 7B:
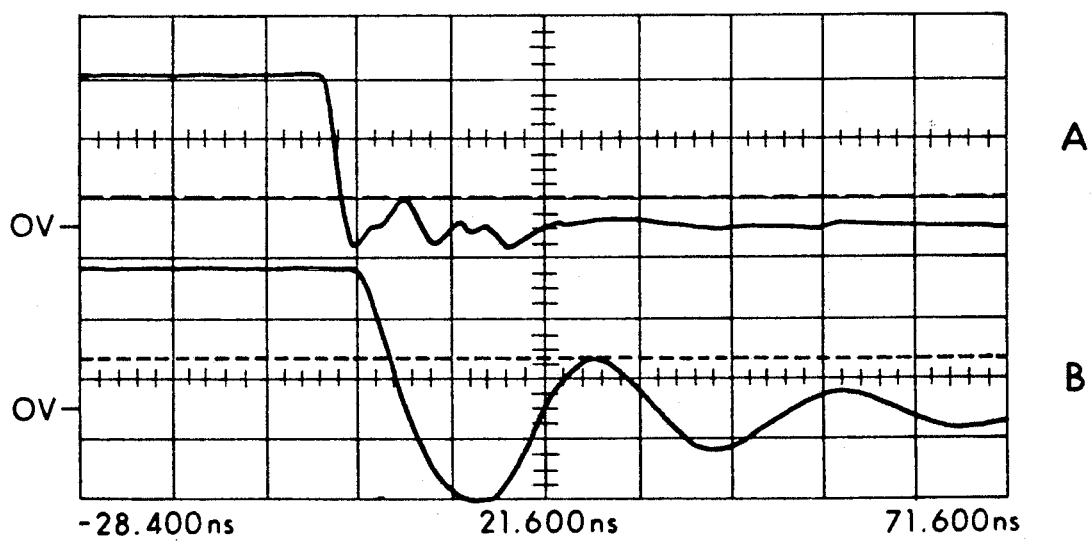
Figure 7C:
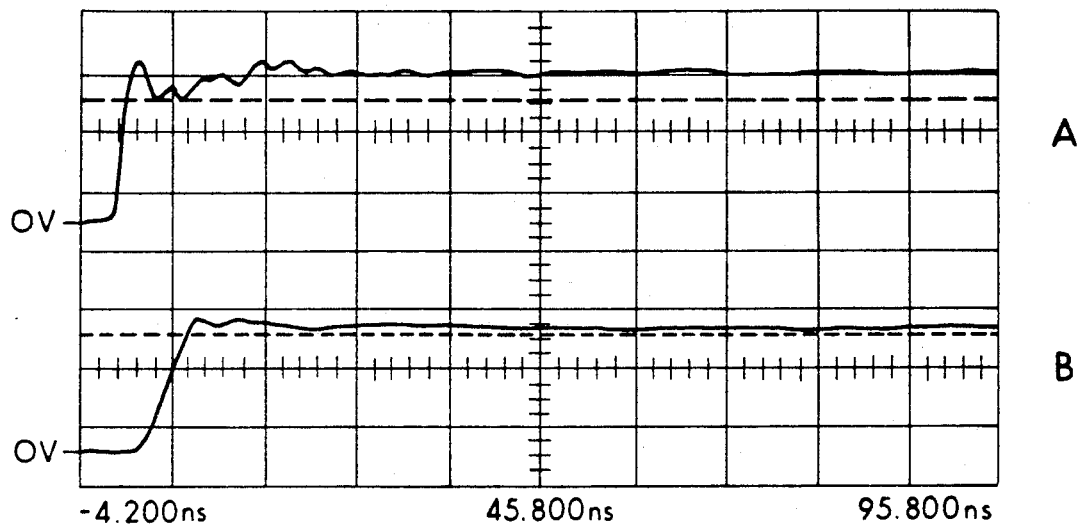
Figure 7D:
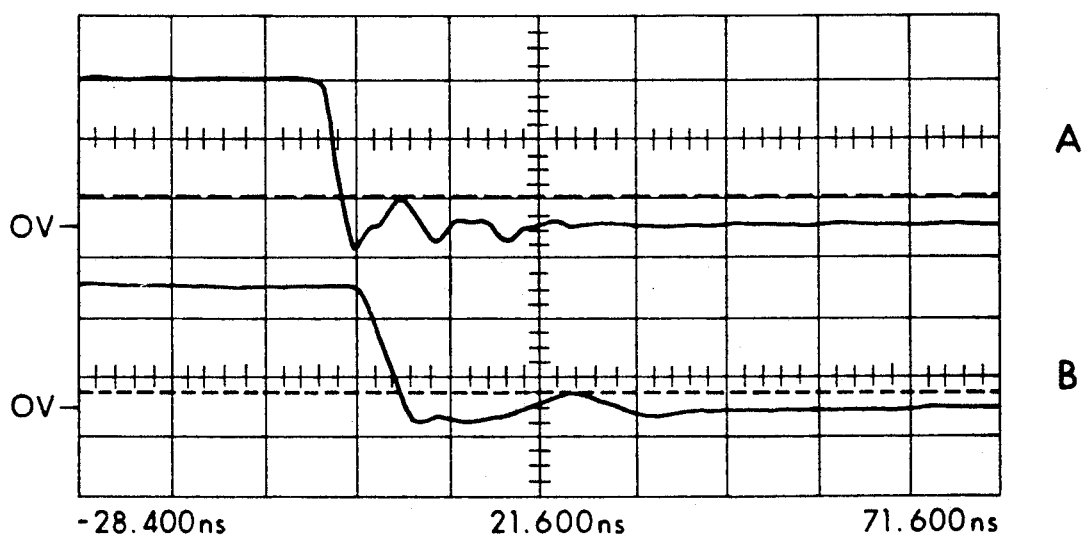

FIGS. 7a and 7b illustrate the rising and falling edges of an 74ACT00 (same setup/measurement technique as used in FIGS. 5 and 6) with the termination turned off (programmed to CHI and CLO) FIGS. 7c and 7d are the equivalent waveforms with the termination turned on. Notice the difference in the bottom waveforms B of 7a and 7c. There is distinctly less overshoot and lessening in the DC level achieved by the part. Likewise, the bottom waveforms of 7b and 7d can be compared. Here a dramatic decrease in ringing can be observed. Finally, note the top waveforms of the pairs 7a and 7c, 7b and 7d are not affected by the presence or absence of the termination. This implies that the DUT is fully capable of driving the small load presented by the termination.

It is to be expressly understood that the claimed invention is not to be limited to the description of the preferred embodiment but encompasses other modifications and alterations within the scope and spirit of the inventive concept.

I claim:

1. A system for providing active receiver termination in automatic test equipment, said automatic test equipment being capable of testing a plurality of devices under test, said automatic test equipment having a plurality of automatic test equipment receivers and receiver termination system, each of said automatic test equipment receivers being connected to said receiver termination system, said plurality of devices under test being connected over individual fixture interface transmission lines with said receiver termination system, said system for providing receiver termination comprising:
   a plurality of receiver terminations, each of said receiver terminations being connected between one of said automatic test equipment receivers and an individual device under test,
   an analog reference control connected to each of said plurality of receiver terminations for delivering to each of said plurality of receiver terminations programmed reference voltage clamping values for enabling each said receiver termination to provide line termination for said individual device under test connected to the aforesaid receiver termination so as to minimize ringing.

2. A system for providing receiver termination in automatic test equipment, said automatic test equipment being capable of testing a plurality of devices under test, said automatic test equipment having a plurality of automatic test equipment receivers and receiver termination system, each of said automatic test equipment receivers being connected to said receiver termination system, said system being connected to an analog switch, and a subset of said plurality of devices under test being connected over individual fixture interface transmission lines with each said receiver termination system, each said device under test delivering digital signals on said transmission line, said system for providing receiver termination comprising:
   a plurality of receiver terminations, each of said receiver terminations being connected between one of said automatic test equipment receivers and said analog switch,
   an analog reference control connected to each of said plurality of receiver terminations for delivering to each of said plurality of receiver terminations programmed high and low reference voltage values for enabling each said receiver termination to provide proper line termination to provide proper line termination by clamping each of said digital signals above said high reference voltage and below said low reference voltage for the individual device under test connected by said analog switch to the aforesaid receiver termination.

3. The receiver termination system of claim 2 wherein said analog reference control comprises:
   a state machine, said start machine containing said plurality of said programmed high and low reference voltage values corresponding to the different logic-family types of said devices under test,
   means receptive of each said programmed high and low reference voltage value for converting each of the aforesaid values into a corresponding high and low reference voltage value.

4. The receiver termination system of claim 2 wherein each of said plurality of receiver terminations comprises:
   first means receptive of said high reference voltage value for clamping signals appearing on the input to said receiver at said high reference voltage value,
   second means receptive of said low reference voltage value for clamping signals appearing on the input to said receiver at said low reference voltage value.

5. The receiver termination system of claim 4 wherein each of said first and second clamping means comprises:

an amplifier for receiving said high or low reference voltage clamping value, a resistor having one end connected to the output of said amplifier, a capacitor connecting ground to the other end of said resistor, a diode connected between said other end of said resistor and said input of said receiver.

6. A circuit for providing active termination for a transmission line carrying digital signals from one of a plurality of devices connected at one end of said transmission line, said circuit comprising:

a resistor having one end connected with the opposite end of said transmission line, first means connected to the second end of said resistor for clamping the rising edge of each of said digital signals from said one of a plurality of devices to a predetermined high voltage value assigned for said one of a plurality of devices, when the voltage of said rising edge exceeds said predetermined high voltage, said first clamping means directs current from each of said digital signals away from said transmission line to minimize ringing on said transmission line, and second means connected to said second end of said resistor for clamping the falling edge of each of said digital signals from said one of a plurality of devices to a predetermined low voltage value assigned for said one of a plurality of devices, when the voltage of said falling edge of each of said digital signals exceeds said predetermined low voltage, said second clamping means directs said current from each of said digital signals away from said transmission line to minimize ringing on said transmission line, means connected to said first and second clamping means for storing predetermined high and low voltage values for said plurality of devices, said storing means delivering said assigned predetermined high voltage value to said first clamping means and delivering said assigned predetermined low voltage value to said second clamping means when said first and second clamping means are connected to said one of a plurality of devices.

7. A circuit for providing active termination for a transmission line carrying digital signals from a device connected at one end of said transmission line, said circuit comprising:

a line resistor having one end connected with the opposite end of said transmission line, first means connected to the second end of said line resistor for clamping the rising edge of each of said digital signals from said device to a predetermined high voltage value, when the voltage of said rising edge exceeds said predetermined high voltage, said first clamping means directs current from said digital signal away from said transmission line to minimize ringing on said transmission line, wherein said first clamping means comprises:

(a) a diode having its anode connected to said second end of said line resistor, (b) a capacitor having one end connected to the cathode of said diode and its other end connected to ground, (c) a resistor having one end connected to said cathode of said diode, and (d) means connected to the other end of said resistor for delivering said predetermined high voltage value, and second means connected to said second end of said line resistor for clamping the falling edge of each of said digital signals from said device to a predetermined low voltage value, when the voltage of said falling edge of each of said digital signals exceeds said predetermined low voltage, said second clamping means directs said current from each of said digital signals away from said transmission line to minimize ringing on said transmission line.

8. A circuit for providing active termination for a transmission line carrying digital signals from a device connected at one end of said transmission line, said circuit comprising:

a line resistor having one end connected with the opposite end of said transmission line, first means connected to the second end of said line resistor for clamping the rising edge of each of said digital signals from said device to a predetermined high voltage value, when the voltage of said rising edge exceeds said predetermined high voltage, said first clamping means directs current from said digital signal away from said transmission line to minimize ringing on said transmission line, and second means connected to said second end of said line resistor for clamping the falling edge of each of said digital signals from said device to a predetermined low voltage value, when the voltage of said falling edge of each of said digital signals exceeds said predetermined low voltage, said second clamping means directs said current from each of said digital signals away from said transmission line to minimize ringing on said transmission line, wherein said second means comprises:

(a) a diode having its cathode connected to said second end of said line resistor, (b) a capacitor having one end connected to the anode of said diode and its other end connected to ground, (c) a resistor having one end connected to said cathode of said diode, and (d) means connected to the other end of said resistor for delivering said predetermined high voltage value.

9. A circuit for providing active programmable termination for a transmission line carrying digital signals from a device connected at one end of said transmission line, said circuit comprising:

a line resistor having one end connected with the opposite end of said transmission line, first means connected to the second end of said line resistor for clamping the rising edge of each of said digital signals from said device to a predetermined high voltage value, so that when the voltage of said rising edge exceeds said predetermined high voltage, said first clamping means directs current from each of said digital signals away from said transmission line to minimize ringing on said transmission line, said first means comprises:

(a) a diode connected having its anode connected to said second end of said line resistor, (b) a capacitor having one end connected to the cathode of said diode and its other end connected to ground, (c) a first resistor having one end connected to said cathode of said diode, and (d) means connected to the other end of said first resistor for delivering said predetermined high voltage value, and second means connected to said second end of said line resistor for clamping the falling edge of each of said digital signals from said device to a predetermined low voltage value, when the voltage of said falling edge of each of said digital signals exceeds said predetermined low voltage, said second clamping means directs current from each of said digital signals away from said transmission line to minimize ringing on said transmission line, said second means comprises:

(a) a diode having its cathode connected to said second end of said line resistor, (b) a capacitor having one end connected to the anode of said diode and its other end connected to ground, (c) a second resistor having one end connected to said cathode of said diode, and (d) means connected to the other end of said second resistor for delivering said predetermined low voltage value.

10. A method for providing active termination for a transmission line carrying digital signals from one of a plurality of devices connected at one end of said transmission line, said method comprising the steps of:

clamping the rising edge of each of the digital signals from said one of the plurality of devices at the termination to a predetermined high voltage value assigned to said one of the plurality of devices, when the voltage of the rising edge exceeds the predetermined high voltage the aforesaid step of clamping directs current in the digital signal from said digital signal away from said transmission line to minimize ringing on the transmission line, and clamping the falling edge of each of said digital signals from said one of the plurality of devices to a predetermined low voltage value assigned to said one of the plurality of devices, when the voltage of said falling edge of each of the digital signals exceeds the predetermined low voltage the aforesaid step of clamping directs current from each of said digital signals away from the transmission lien to minimize ringing on the transmission line, storing predetermined high and low voltage values for said plurality of devices, and delivering said assigned predetermined high voltage value for the step of clamping the rising edge and delivering said assigned predetermined low voltage value for the step of clamping the falling edge.

* * * * *